(12) United States Patent
Hshieh

(10) Patent No.: US 8,252,645 B2
(45) Date of Patent: Aug. 28, 2012

(54) METHOD OF MANUFACTURING TRENCHED MOSFETS WITH EMBEDDED SCHOTTKY IN THE SAME CELL

(75) Inventor: Fwu-ruan Hshieh, Saratoga, CA (US)

(73) Assignee: Force_Mos Technology Corporation (KY)

( * ) Notice: Subject to any disclaimer, the term of this patent is extended or adjusted under 35 U.S.C. 154(b) by 587 days.

(21) Appl. No.: 12/462,748

(22) Filed: Aug. 7, 2009

(65) Prior Publication Data

US 2009/0305475 A1 Dec. 10, 2009

Related U.S. Application Data

(62) Division of application No. 11/732,955, filed on Apr. 4, 2007, now abandoned.

(51) Int. Cl.
*H01L 21/336* (2006.01)

(52) U.S. Cl. .......................... 438/259; 438/200; 438/237

(58) Field of Classification Search .................. 438/167, 438/169, 200, 237, 259, 266, 386, 388, 389
See application file for complete search history.

(56) References Cited

U.S. PATENT DOCUMENTS

| | | | | |
|---|---|---|---|---|
| 4,357,178 A * | 11/1982 | Bergeron et al. | ............. | 438/534 |
| 4,946,803 A * | 8/1990 | Ellwanger | ..................... | 438/581 |
| 5,244,832 A * | 9/1993 | Morris et al. | .................. | 438/328 |
| 6,049,108 A * | 4/2000 | Williams et al. | .................. | 257/341 |
| 6,855,999 B2 * | 2/2005 | Hwang et al. | .................. | 257/483 |
| 2005/0258541 A1* | 11/2005 | Yanagisawa | .................. | 257/751 |
| 2006/0060916 A1* | 3/2006 | Girdhar et al. | ................ | 257/330 |
| 2006/0180855 A1* | 8/2006 | Bhalla et al. | .................. | 257/330 |

* cited by examiner

*Primary Examiner* — Kevin M Picardat
(74) *Attorney, Agent, or Firm* — Bo-In Lin

(57) ABSTRACT

A method for manufacturing a trenched semiconductor power device includes a step of forming said semiconductor power device with a trenched gate surrounded by a source region encompassed in a body region above a drain region disposed on a bottom surface of a substrate. The method further includes the steps of covering the MOSFET cell with an insulation layer and applying a contact mask for opening a source-body contact trench extending through the source and body regions into an epitaxial layer underneath for filling a contact metal plug therein. And, the method further includes a step of forming an embedded Schottky diode by forming a Schottky barrier layer near a bottom of the source-body contact trench below the contact metal plug with the Schottky barrier layer having a barrier height for reducing a leakage current through the embedded Schottky diode during a reverse bias between the drain and the source.

9 Claims, 17 Drawing Sheets

US 8,252,645 B2

METHOD OF MANUFACTURING TRENCHED MOSFETS WITH EMBEDDED SCHOTTKY IN THE SAME CELL

This Patent Application is a Divisional Application and claims the Priority Date of a application Ser. No. 11/732,955 filed on Apr. 4, 2007 now abandoned by common Inventors of this Application. The Disclosures made in the patent application Ser. No. 11/732,955 are hereby incorporated by reference.

BACKGROUND OF THE INVENTION

1. Field of the Invention

This invention relates generally to the cell structure, device configuration and fabrication process of power semiconductor devices. More particularly, this invention relates to a novel and improved cell configuration and processes to manufacture MOSFET device with embedded Schottky diodes in the same cell such that integrated cells with spacing savings and lower capacitance and higher performance are achieved.

2. Description of the Related Art

Conventional technologies for high efficiency DC/DC applications, a Schottky diode are usually added externally in parallel to a semiconductor power device, e.g., a power MOSFET device. FIG. 1A is a circuit diagram that illustrates the implementation of a Schottky with a power MOSFET device. The Schottky diode (SKY) is connected in parallel to the MOSFET device with a parasitic PN body diode to function as a clamping diode to prevent the body diode from turning on. In order to achieve higher speed and efficiency, once the parasitic P/N diode is turned on, both the electron and hole carriers are generated and that would require longer time to eliminate the carriers by electron-hole combination while the Schottky Diode is single carrier, i.e., electron carrier only and that can be drawn simply by the drain Electrode. The requirement for the clamping effect is that the Forward Voltage of the Schottky diode Vf is less than the parasitic PN diode (~0.7V). As the electronic devices become more miniaturized, there are requirement to integrate the Schottky diode as part of the semiconductor power device as an IC chip to reduce the space occupied by the Schottky diode instead of connecting the Schottky diode as an external electronic component.

FIG. 1B is a cross sectional view of a trenched MOSFET device integrated with trench Schottky diodes as that disclosed by U.S. Pat. No. 6,351,018. The configuration as disclosed in the patented invention has a disadvantage that the Schottky diodes occupy additional space that is about the same space as the MOSFET. The trench Schottky diodes further suffer from a high leakage between the drain and source due to the increase in the phosphorus dopant concentration in the channel region during the sacrificial and gate oxidation processes. Furthermore, the device as shown has a higher capacitance due to the presence of the trench MOS-Schottky structure which has inherent parasitic capacitance from trench sidewall and bottom in trench MOS-Schottky as shown in left side of the cross section view in FIG. 1B.

In U.S. Pat. No. 6,433,396, a trench MOSFET device with a planar Schottky diode is disclosed as that shown in FIG. 1C. The configuration again has an advantage that the planar Schottky diode occupies additional space. Also, the formation process requires additional contact mask for the Schottky diode thus increases the cost and processes complications for producing the MOSFET power device with Schottky diode.

In U.S. Pat. No. 6,998,678 discloses another trench semiconductor arrangement as shown in FIG. 1D with a MOS transistor which has a gate electrode, arranged in a trench running in the vertical direction of a semiconductor body, and a Schottky diode which is connected in parallel with a drain-source path (D-S) and is formed by a Schottky contact between a source electrode and the semiconductor body. Again, the configuration has the same disadvantage that the Schottky diodes occupy additional space thus limiting the further miniaturization of the device. Furthermore, the manufacturing cost is increased due to the requirement that an additional P+ mask is required to form the Schottky diodes.

Therefore, there is still a need in the art of the semiconductor device fabrication, particularly for design and fabrication of the trenched power device, to provide a novel cell structure, device configuration and fabrication process that would resolve these difficulties and design limitations. Specifically, it is desirable to provide more integrated semiconductor power devices with embedded Schottky diode that can accomplish space saving and capacitance reduction such that the above discussed technical limitations can be resolved.

SUMMARY OF THE PRESENT INVENTION

It is therefore an aspect of the present invention to provide new and improved semiconductor power device configuration and manufacture processes for providing semiconductor power devices with embedded Schottky diode such that space occupied by separate Schottky diodes can be saved and one of the major technical limitations discussed above can be overcome.

Another aspect of the present invention is to provide new and improved semiconductor power device configuration and manufacture processes for providing semiconductor power devices with embedded Schottky diode in the same cell such that parasitic capacitance can be reduced and device performance can be improved.

Another aspect of the present invention is to provide new and improved semiconductor power device configuration and manufacture processes for providing semiconductor power devices with embedded Schottky diode in the same cell wherein the manufacturing processes can be simplified with reduced number of masks required such that the production costs can be reduced and reliability of the products can be enhanced.

Another aspect of the present invention is to provide new and improved semiconductor power device configuration and manufacture processes for providing semiconductor power devices with embedded Schottky diode in the same cell wherein a dopant regions is provided at the bottom of a contact trench below the Schottky layer to reduce the forward voltage of the Schottky diodes such that improved device performance is achieved.

Another aspect of the present invention is to provide new and improved semiconductor power device configuration and manufacture processes for providing semiconductor power devices with embedded Schottky diode in the same cell wherein a dopant regions is provided at the bottom of a contact trench below the Schottky layer to reduce the ldsx is reduced and device performance improvements are achieved.

Briefly, in a preferred embodiment, the present invention discloses a semiconductor power device comprising trenched semiconductor power device comprising a trenched gate surrounded by a source region encompassed in a body region above a drain region disposed on a bottom surface of a substrate. The semiconductor power device further includes an insulation layer covering the trenched semiconductor power device with a source-body contact trench opened therethrough and further through the body regions into an epitaxial layer underneath and filled with contact metal plug therein.

The semiconductor power device further includes an embedded Schottky diode disposed near a bottom of the source-body contact trench below the contact metal plug wherein the Schottky diode further includes a Schottky barrier layer having a barrier height for reducing a leakage current through the embedded Schottky diode during a reverse bias between the drain and the source. In an exemplary embodiment, the semiconductor power device further includes a contact enhancement dopant region disposed along a sidewall of the source-body contact trench for improving an electrical contact of the contact metal plug to the source and body regions. In an exemplary embodiment, the embedded Schottky diode further includes a CoSi2/TiN barrier layer disposed below the contact metal plug. In an exemplary embodiment, the metal contact plug further includes a tungsten plug filling in the source-body contact trench for contacting the body regions. In an exemplary embodiment, the a contact enhancement dopant region disposed along a side wall of the source-body contact trench further includes a P-type body-dopant region for improving an electrical contact of the contact metal plug to the body regions. In an exemplary embodiment, the embedded Schottky diode further includes a PtSi barrier layer disposed below the contact metal plug. In an exemplary embodiment, the embedded Schottky diode further includes a barrier layer having a barrier height larger than a leakage prevention voltage for preventing a leakage current during a reverse bias between the drain and the source and the barrier layer having a forward voltage drop less than a parasitic body diode between the body region and an epitaxial layer surrounding the body region. In an exemplary embodiment, the contact metal plug further includes a Ti/TiN barrier layer surrounding a tungsten core as a source-body contact metal. In an exemplary embodiment, the semiconductor power device further includes a thin resistance-reduction conductive layer disposed on a top surface covering the insulation layer and contacting the contact metal plug whereby the resistance-reduction conductive layer having a greater area than a top surface of the contact metal plug for reducing a source-body resistance. In an exemplary embodiment, the semiconductor power device further includes a thin resistance-reduction conductive layer includes a Ti or Ti/TiN layer disposed on a top surface covering the insulation layer and contacting the contact metal plug whereby the resistance-reduction conductive layer having a greater area than a top surface of the contact metal plug for reducing a source-body resistance. In an exemplary embodiment, the semiconductor power device further includes a thick front metal layer disposed on top of the resistance-reduction layer for providing a make contact with layer for a wire or wireless bonding package. In an exemplary embodiment, the semiconductor power device further includes a trenched MOSFET device. In an exemplary embodiment, the semiconductor power device further includes a source-dopant region disposed below the source-body contact trench in contact with the barrier layer of the Schottky diode having a dopant concentration of N2 with N2>N1 where N1 is a dopant concentration of an epitaxial layer surrounding the body region supported on the semiconductor substrate. In an exemplary embodiment, the semiconductor power device further includes a source-dopant region disposed below the source-body contact trench in contact with the barrier layer of the Schottky diode having a dopant concentration of N2 with N2<N1 to reduce a Drain-Source leakage current at a reverse bias where N1 is a dopant concentration of an epitaxial layer surrounding the body region supported on the semiconductor substrate. In an exemplary embodiment, the trenched gate is filled with a dielectric material padded by a gate oxide layer with a bottom gate oxide layer significantly thicker than the gate oxide layer disposed along sidewalls of the trenched gate.

These and other objects and advantages of the present invention will no doubt become obvious to those of ordinary skill in the art after having read the following detailed description of the preferred embodiment, which is illustrated in the various drawing figures.

DETAILED DESCRIPTION OF THE PREFERRED EMBODIMENT

Figure 1A:
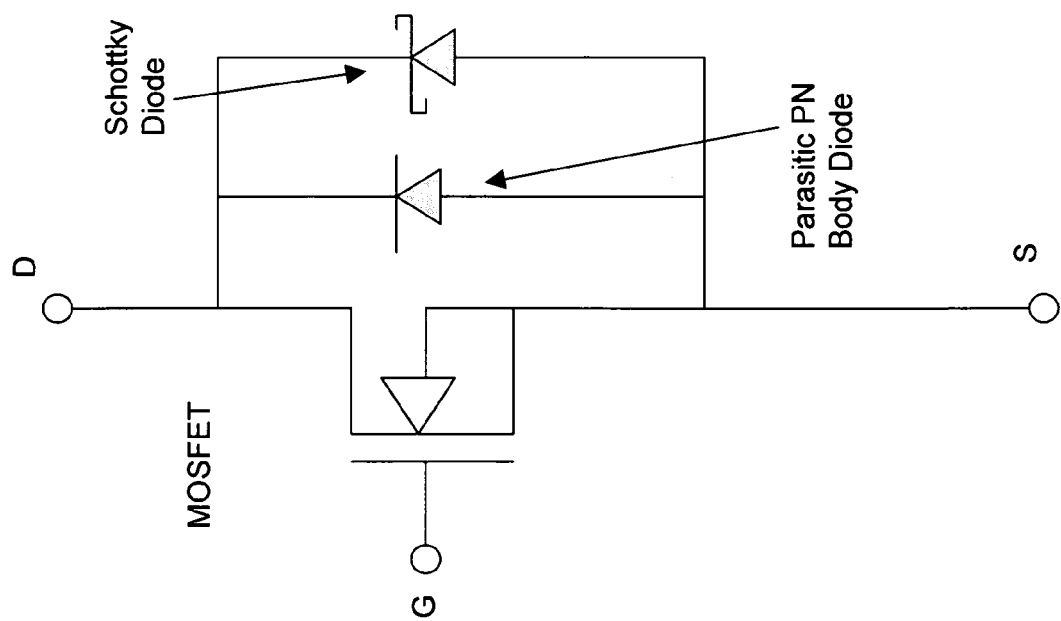
FIGS. 1A to 1D are circuit diagram and cross sectional views of MOSFET power devices of related disclosures of conventional device configurations implemented with various Schottky diode integrations.
Figure 1B:
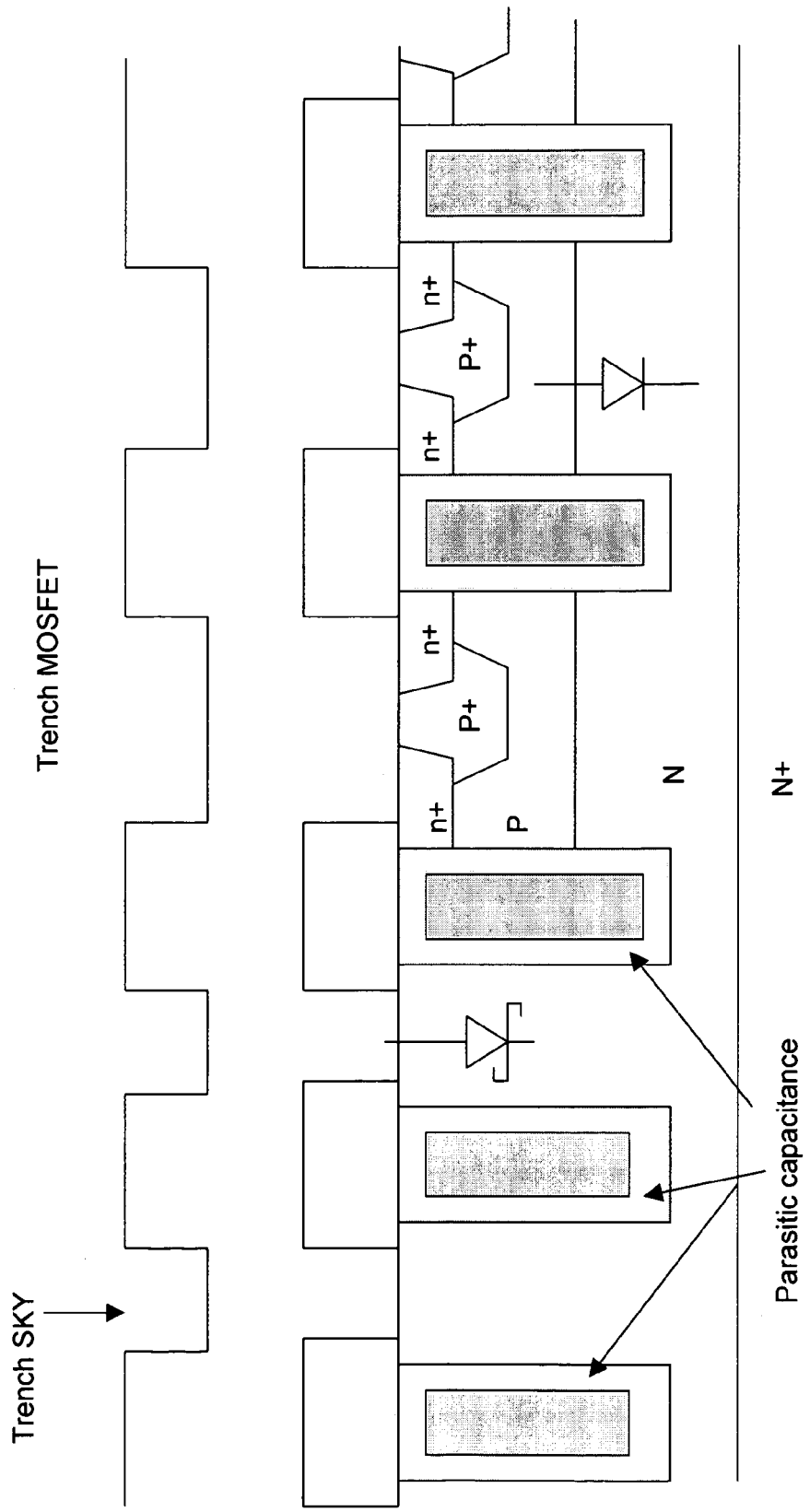
Figure 1C:
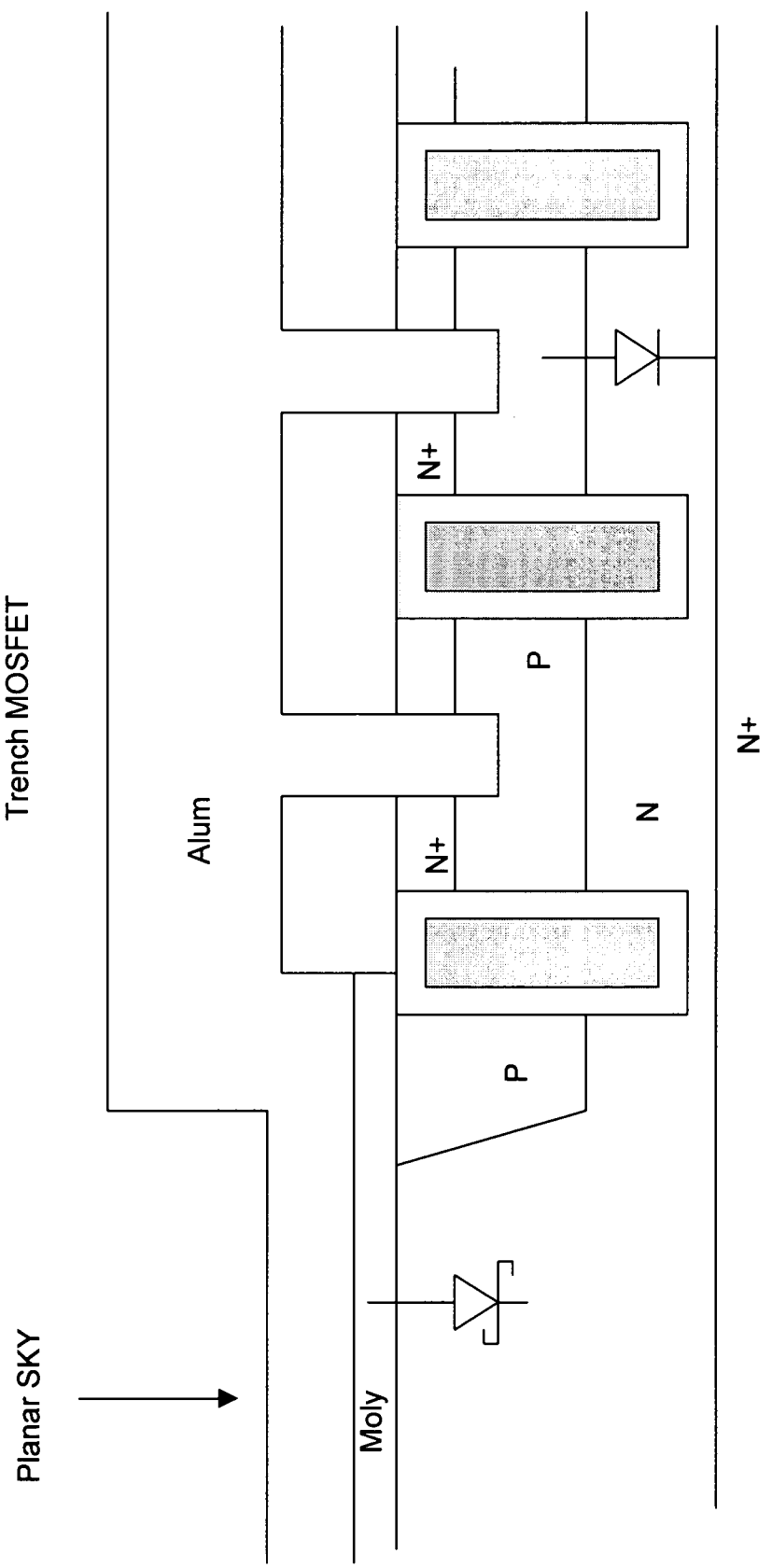
Figure 1D:
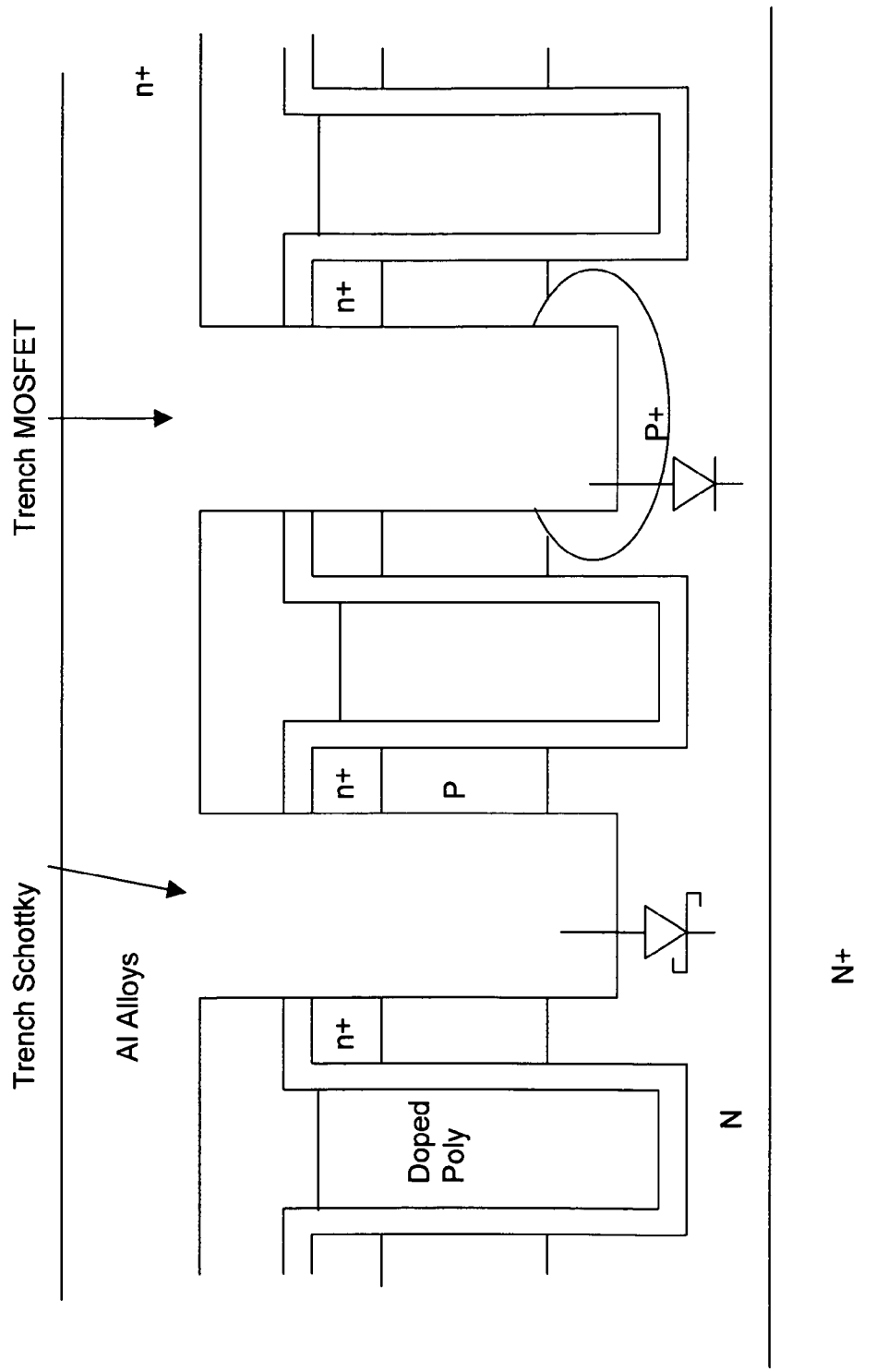
Figure 2:
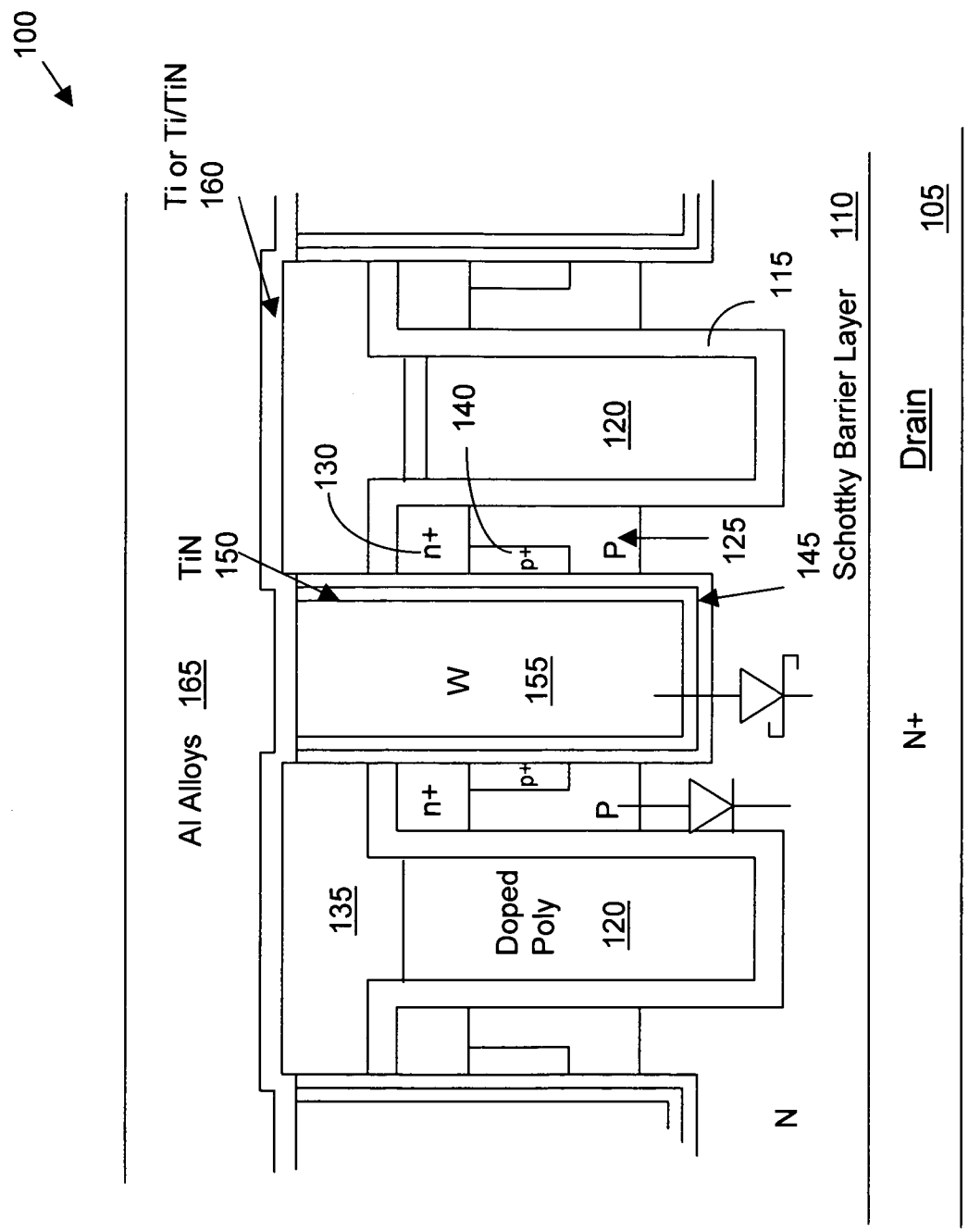
FIGS. 2 to 7 are cross sectional views for showing the semiconductor power devices with embedded Schottky diodes in the same cell disposed on the source/body contact trenches as various exemplary embodiments of this invention.

Please refer to FIG. 2 shows a side cross-sectional view of a trench MOSFET 100 with embedded Schottky in the same cell of this invention. The trenched MOSFET 100 is supported on a substrate 105 formed with an epitaxial layer 110. The MOSFET device 100 includes trenched gates 120 disposed in a trench with a gate insulation layer 115 formed over the walls of the trench. A body region 125 that is doped with a dopant of second conductivity type, e.g., P-type dopant, extends between the trenched gates 120. The P-body regions 125 encompassing a source region 130 doped with the dopant of first conductivity, e.g., N+ dopant. The source regions 130 are formed near the top surface of the epitaxial layer surrounding the trenched gates 120. The trench MOSFET device includes an embedded Schottky formed near the bottom of the trench contact filled with a tungsten plug 155. The Schottky diodes are formed in the contact trench with a CoSi2/TiN layer 145 and a barrier layer 150 underneath the trench contact 155. In order to improve the source/body contact, a P+ dopant region 140 is formed along the sidewall to have improved ohmic contact between the trench contact 155 and the P-body regions 125. The MOSFET device with the embedded Schottky diodes is covered with a low resistance layer composed of Ti or Ti/TiN that has a large contact area to the tungsten trench contact 155 and extending over the oxide insulation layer 135 on top of the trench gates 120. A metal layer 165 composed of aluminum alloy covering the device is patterned into gate pad and source/body contacts (not specifically shown). As shown in FIG. 2, the Schottky barrier layer 145 form the embedded Schottky diodes near the bottom or the trench contact with a parallel parasitic diode formed between the body region 125 and the N-epitaxial layer 110. The barrier layer 145 can be CoSi2, TiSi2 and PtSi, which has barrier height larger than 0.5V, resulting in low leakage current in the embedded Schottky diode during reverse bias between drain and source while providing lower Vf (forward voltage drop) at forward bias than the parasitic body diode between P-body 125 and N epi layer 110. The forward voltage drop Vf and the reverse leakage current Idsx can be optimized by the critical dimension (CD) of the trench contact and depth, and the barrier layer 145.

The MOSFET device with embedded Schottky diodes have the advantages that the Schottky diodes are provided with less space occupied by the Schottky diodes because the diodes are formed as part of the trench contacts in the same area as part of the cells of the MOSFET power device. Compared to the patented inventions disclosed above, the space saving is at least 50%. The source contact with either N+ or P+ regions, i.e., dopant regions 140 are formed on the sidewalls of the trench contact and the Schottky diodes formed on the bottom of the trench contact achieve process savings because there is no requirement of P+ mask when compared with the device as that disclosed in U.S. Pat. No. 6,998,678. Furthermore, since the MOSFET and the Schottky diodes share the same trenches, there is less parasitic capacitance thus providing devices capable of providing higher performance with higher switching speed.

Figure 3:
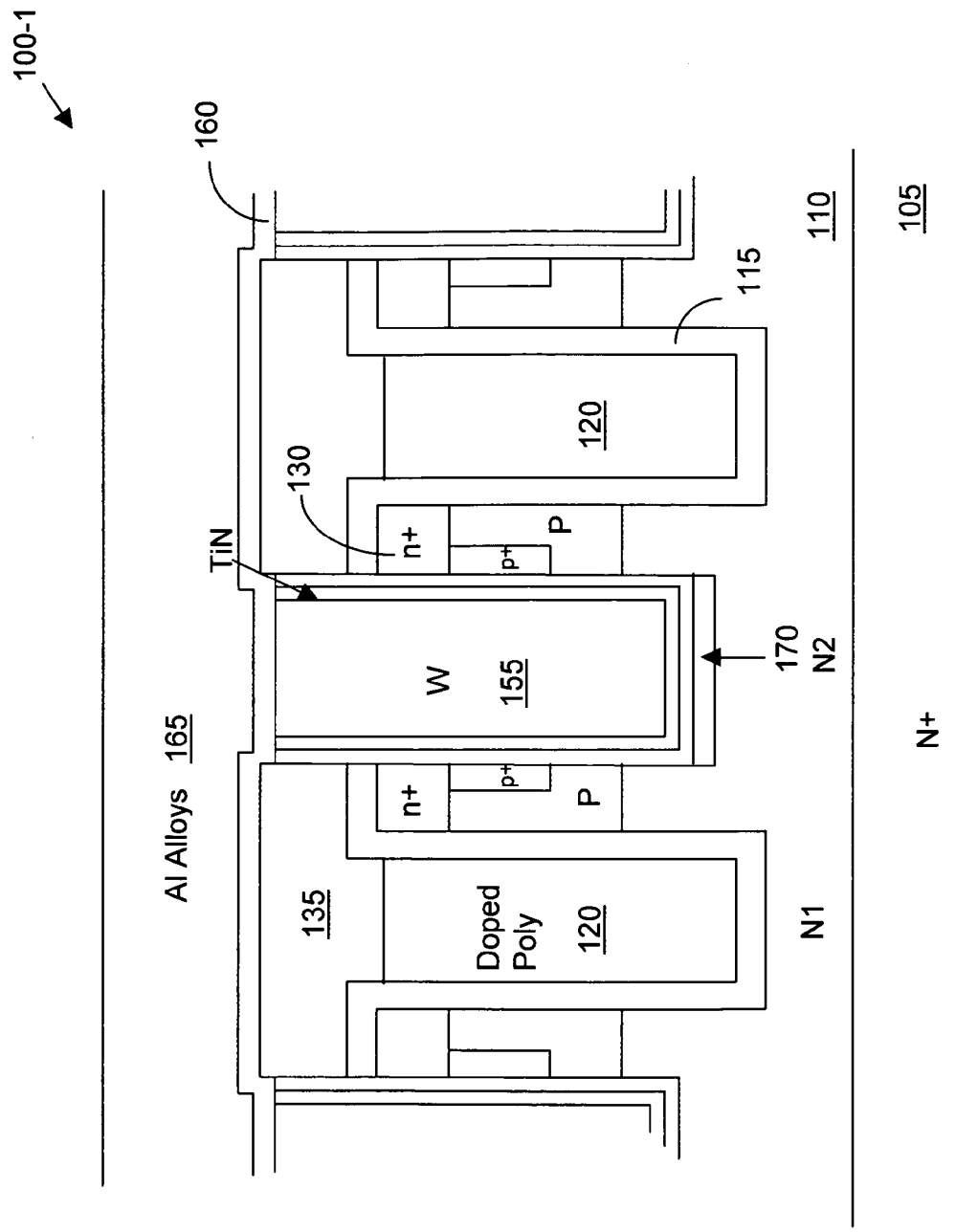

Besides optimizing trench contact CD and depth, and the Schottky barrier layer 145 to target Vf, there is another alternative method to further improve Vf by ion implantation of 1st conductivity dopant into trench bottom. FIG. 3 is another exemplary embodiment of a MOSFET 100-1 with an embedded Schottky in the same cell with an N dopant region 170 having a dopant concentration of N2 where N2>N1 and N1 is the dopant concentration of the epitaxial layer 105. The N-dopant region 170 is provided to lower the Vf of the Schottky diode because the Vf is lower with a higher doping concentration N2 contacting to the Schottky barrier layer 145.

Figure 4:
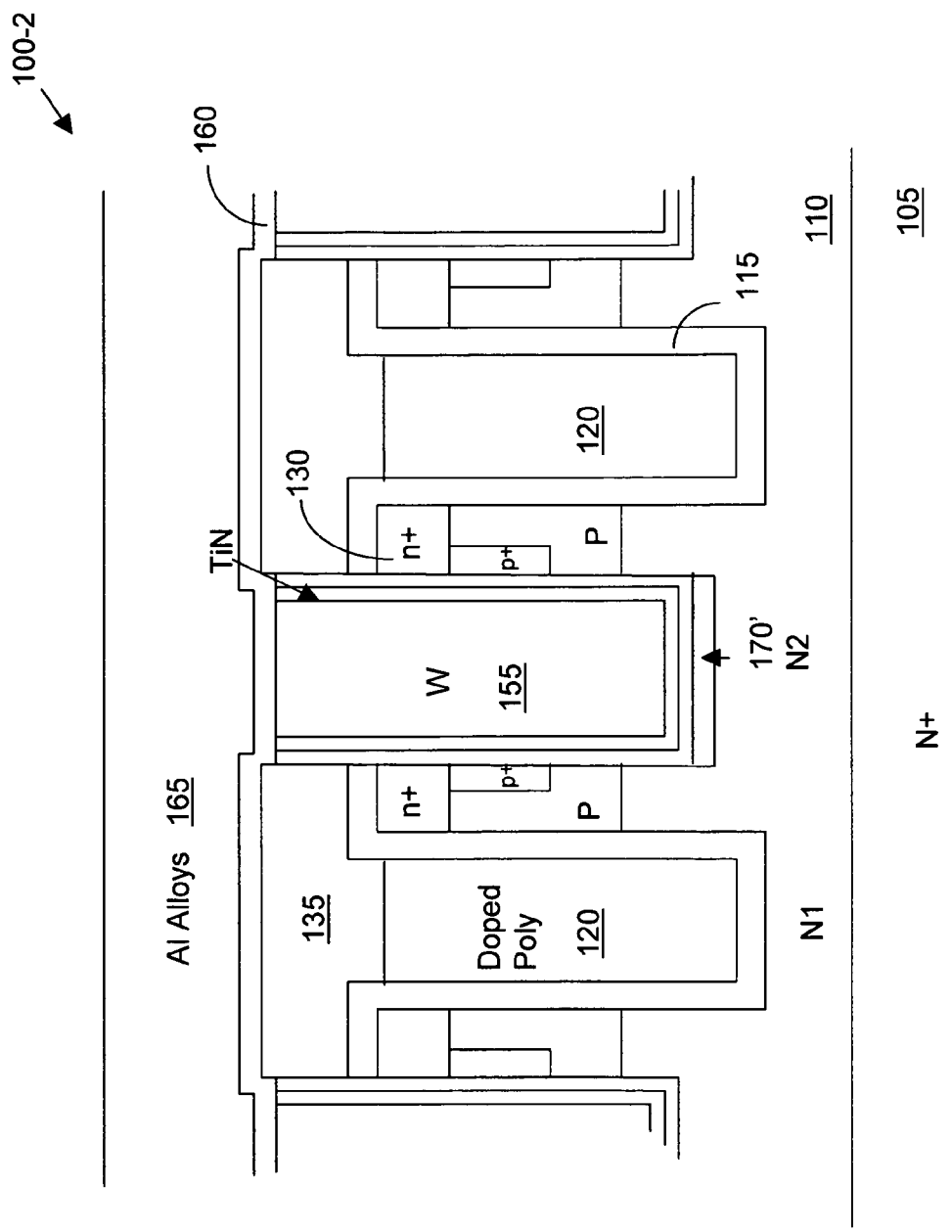

FIG. 4 is another exemplary embodiment of a MOSFET 100-2 with a purpose to reduce the Drain-Source leakage current at reverse bias. The MOSFET 100-2 has an embedded Schottky in the same cell with an N dopant region 170' having a dopant concentration of N2 where N2<N1 and N1 is the dopant concentration of the epitaxial layer 105. The N-dopant region 170' is provided to have a lower Idsx because the N2 is in contact with the Schottky barrier that has lower doping concentration than the epi layer 110. The Schottky contact between the barrier layer and silicon has a lower Vf when the silicon has high doping concentration, and a lower leakage current Idsx between Drain-Source when the silicon has low doping concentration. There is trade-off between the Vf and the Idsx. When the leakage current is too high, the leakage current will consume more power at an off-state, which becomes very undesirable for applications in portable system such as cell phone, notebook using battery.

Figure 5:
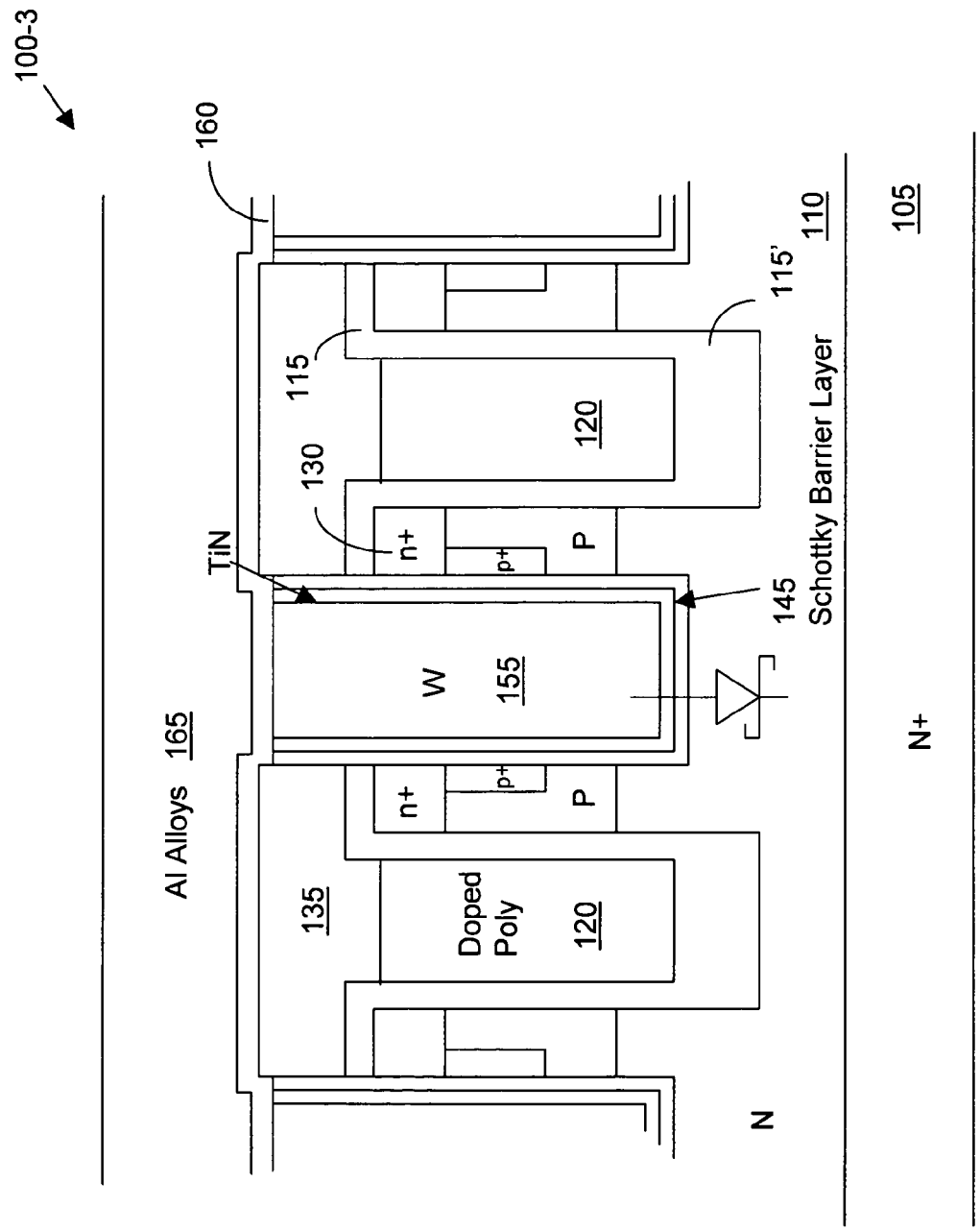

FIG. 5 is another exemplary embodiment of a MOSFET 100-2 with an embedded Schottky in the same cell with a thicker oxide layer 115' at bottom of the trench gate 120. The thicker oxide layer at the bottom of the trench gate 120 which is thinner than gate oxide along trench sidewall, is provided to have a reduce gate-drain capacitance. The thick oxide at trench bottom sandwiched between trench gate and drain has less capacitance than the single gate oxide along trench sidewall because Cgd, i.e., the capacitance between gate and drain, has a reverse proportional relationship with the gate oxide thickness.

Figure 6:
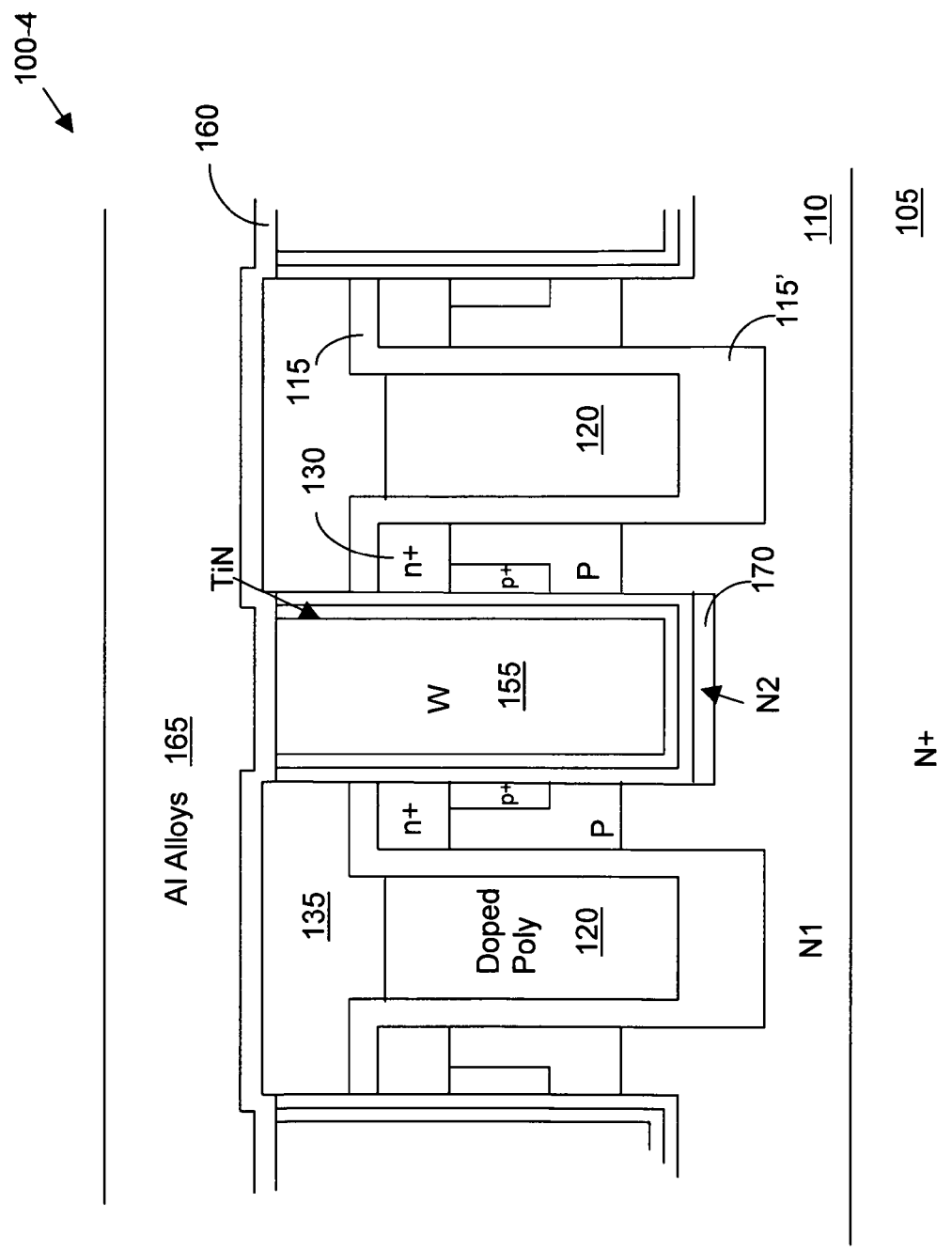

FIG. 6 is another exemplary embodiment of a MOSFET 100-4 with an embedded Schottky in the same cell with an N dopant region 170 having a dopant concentration of N2 where N2>N1 and N1 is the dopant concentration of the epitaxial layer 105. The N-dopant region 170 is provided to lower the Vf of the Schottky diode because lower Schottky barrier height is achieved with the N2 layer. The barrier height of Schottky is function of doping concentration and the barrier layer material. A lower doping concentration leads to a lower Schottky barrier height that results in a lower Vf but higher Idsx. Meanwhile, there is a trade-off between Vf and Idsx. However, the benefit of the N2 is to reduce Vf without degrading the Drain to Source breakdown voltage as a result of same epitaxial doping concentration. Furthermore, the MOSFET 100-4 has a thicker oxide layer 115' at bottom of the trench gate 120. The thicker oxide layer at the bottom of the trench gate 120 is provided to have a reduce gate-drain capacitance.

Figure 7:
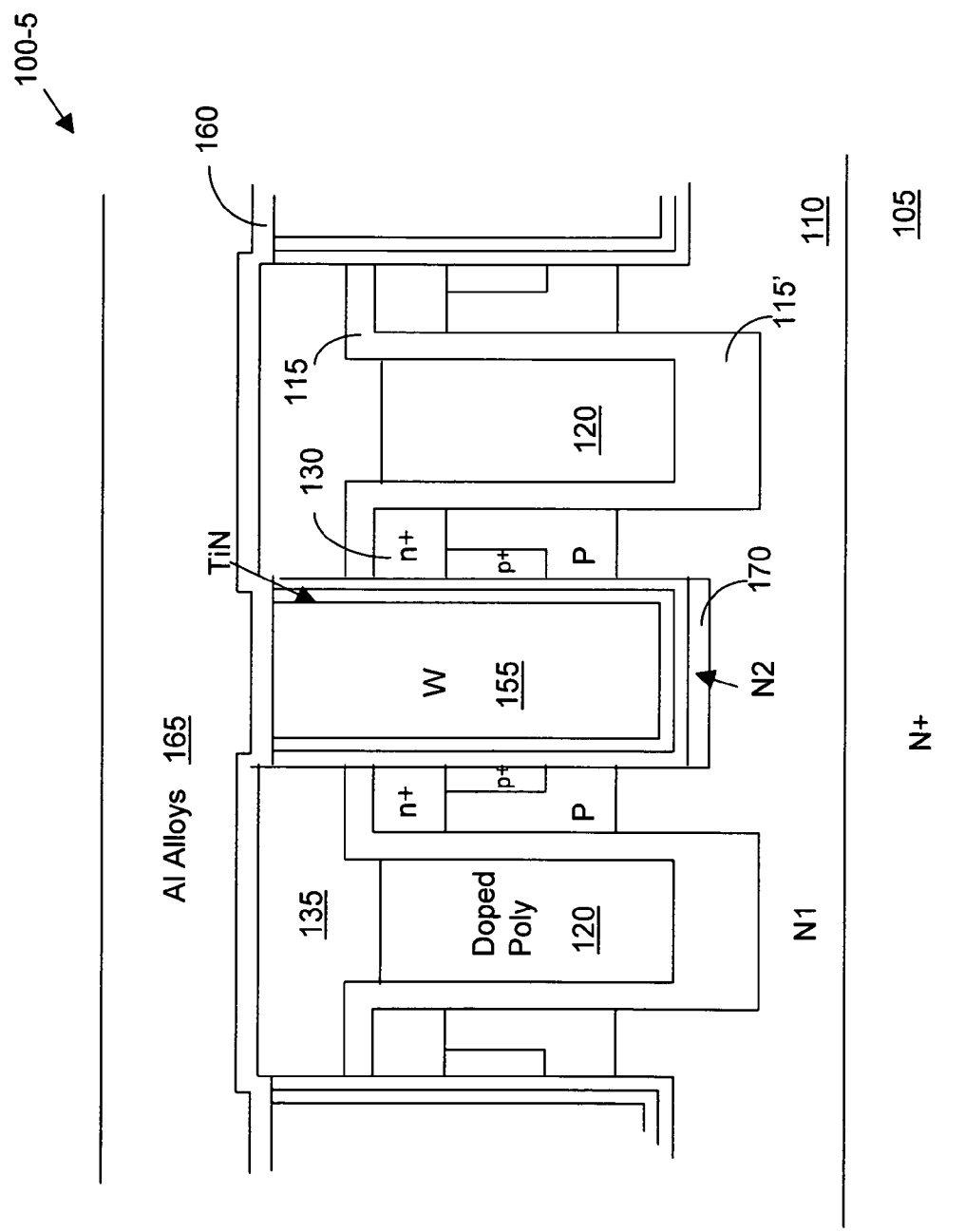

FIG. 7 is another exemplary embodiment of a MOSFET 100-5 with an embedded Schottky in the same cell with an N dopant region 170' having a dopant concentration of N2 where N2<N1 and N1 is the dopant concentration of the epitaxial layer 105. The N-dopant region 170' is provided to have a lower Idsx because N2 has lower doping concentration causing higher Schottky barrier height. Furthermore, the MOSFET 100-5 has a thicker oxide layer 115' at bottom of the trench gate 120. The thicker oxide layer at the bottom of the trench gate 120 is provided to have a reduce gate-drain capacitance.

Figure 8A:
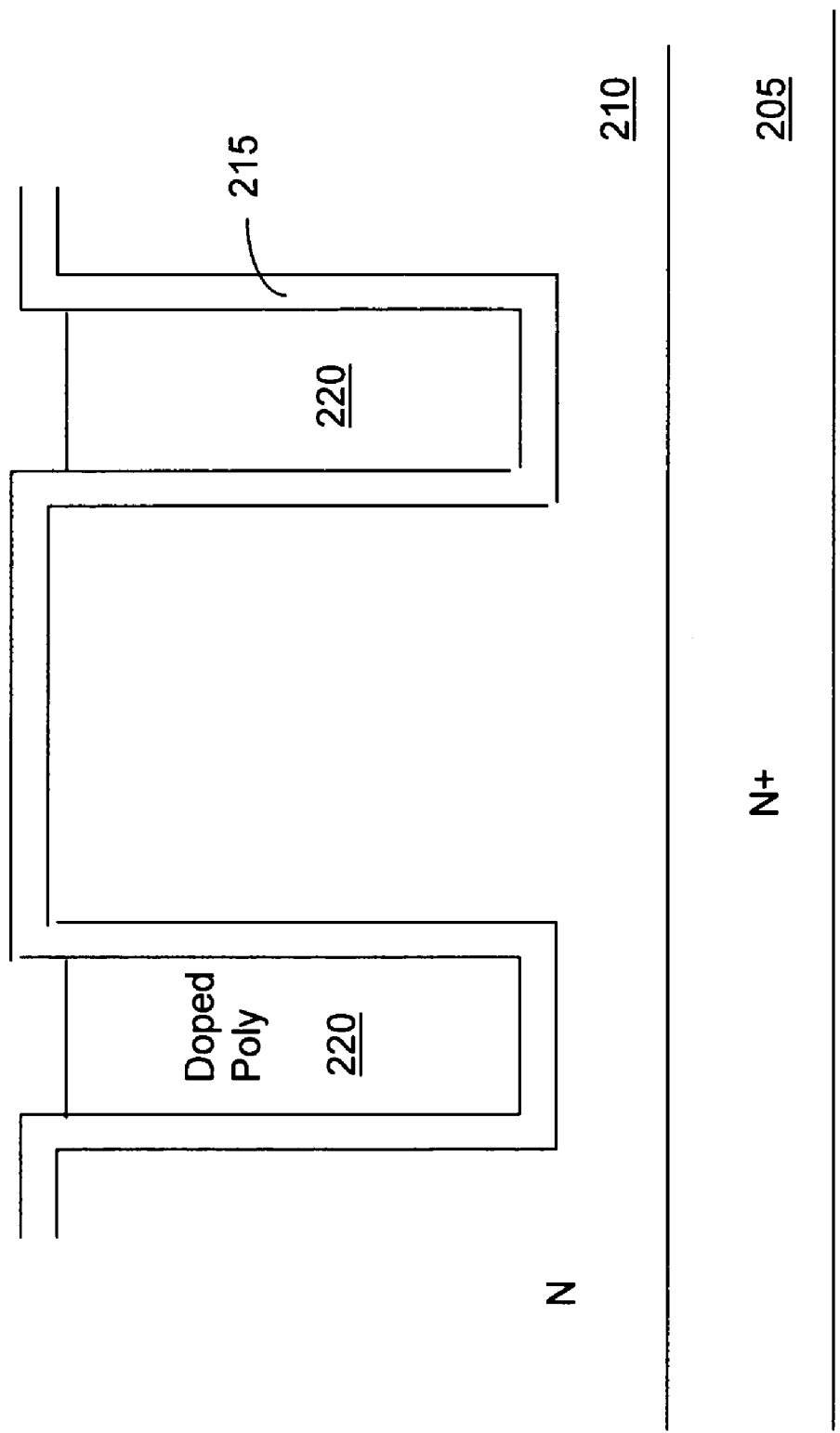
FIGS. 8A to 8G are a serial of side cross sectional views for showing the processing steps for fabricating a MOSFET device as shown in FIGS. 2 and 4 of this invention.
Figure 8B:
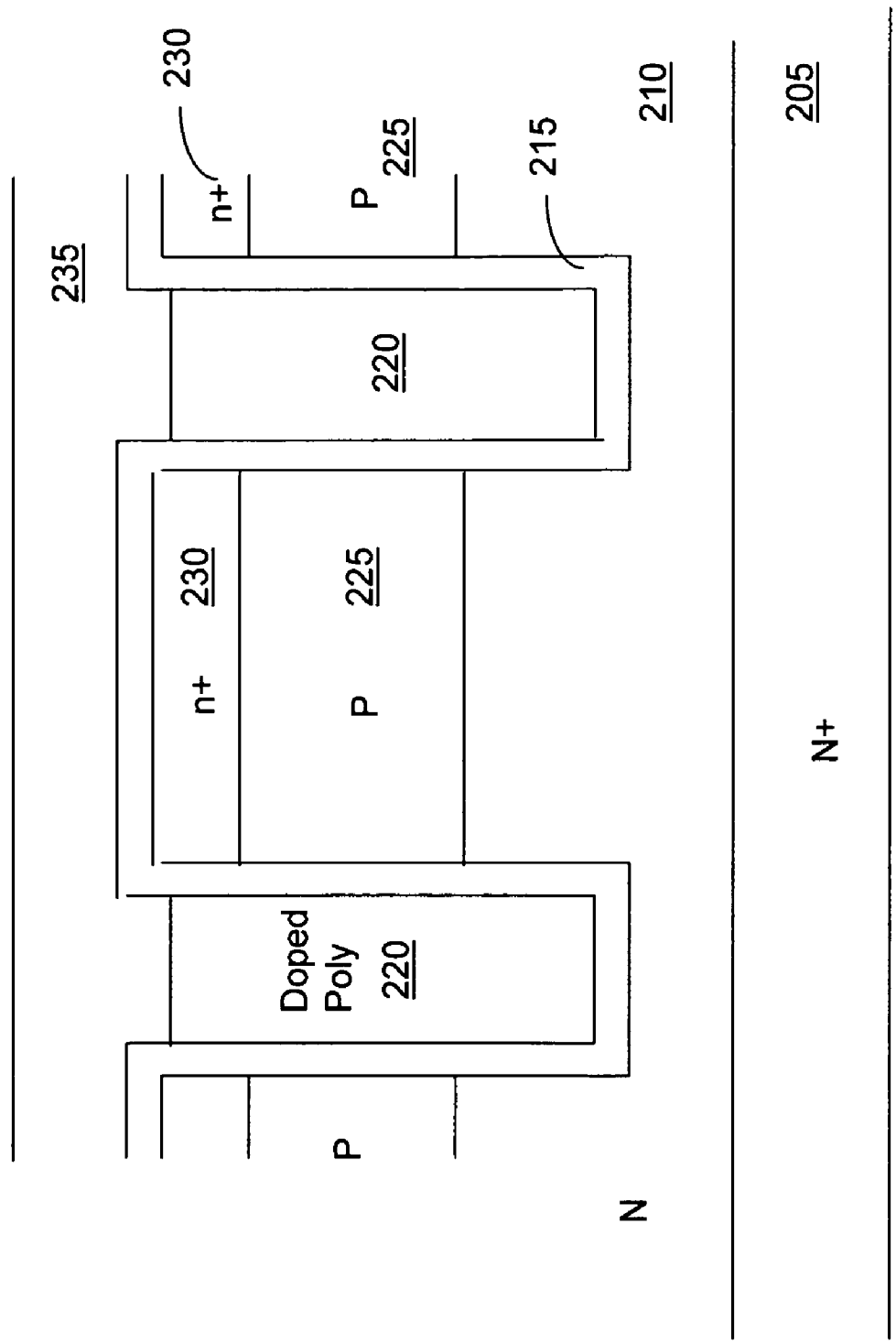
Figure 8C:
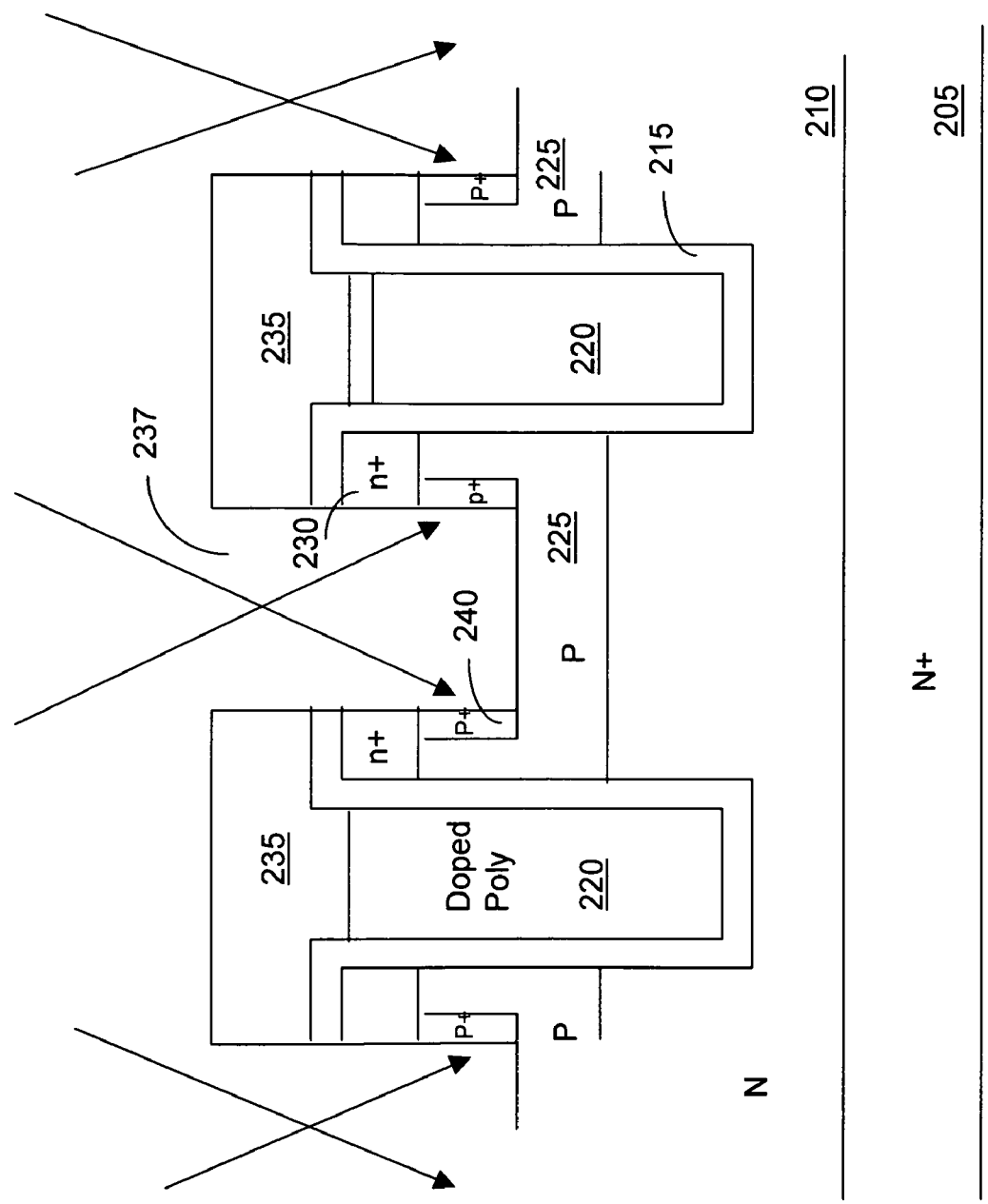
Figure 8D:
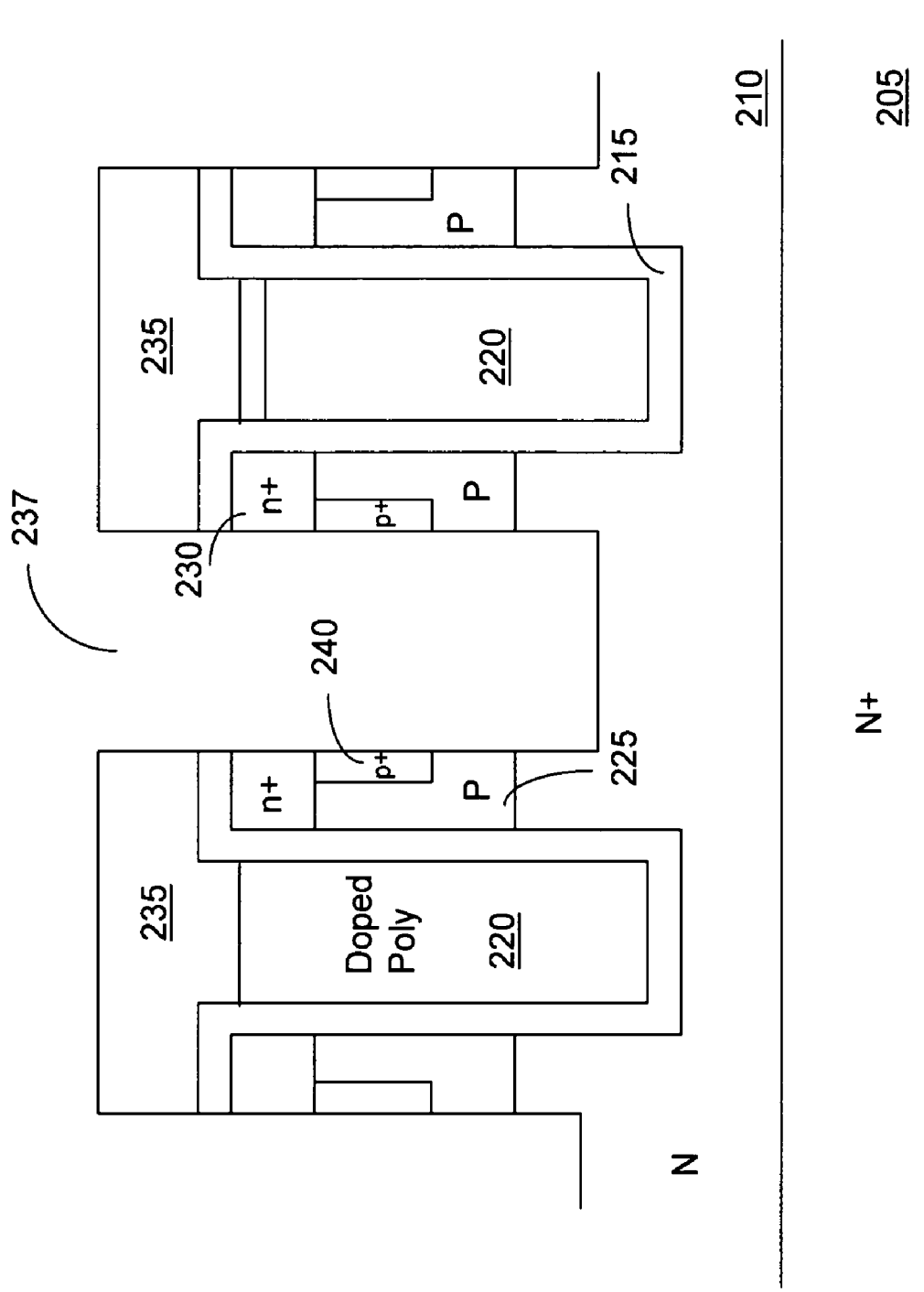

Referring to FIGS. 8A to 8F for a serial of side cross sectional views to illustrate the fabrication steps of a MOSFET device as that shown in FIGS. 2, 3, and 4. In FIG. 4A, a trench mask (not shown) is applied to open a plurality of trenches in an epitaxial layer 210 supported on a substrate 205 by employing a dry silicon etch process. An oxidation process is then performed to form an oxide layer covering the trench walls. The trench is oxidized with a sacrificial oxide to remove the plasma damaged silicon layer during the process of opening the trench. Then an oxide layer 215 is grown followed by depositing a polysilicon layer 220 to fill the trench and covering the top surface and then doped with an N+ dopant. The polysilicon layer 220 filling the trenches are either etched back or removed by applying a chemical mechanical planarization process (CMP) to remove the polysilicon above the top surface. In FIG. 8B, the manufacturing process proceeds by implanting a P-body implant with a P-type dopant. Then an elevated temperature is applied to diffuse the P-body 225 into the epitaxial layer 210. Then a N+ source dopant implant is carried out to form the source regions 230 followed by applying an elevated temperature to diffuse the source regions 230 further into the body region 225. An oxide deposition is then carried out to form a thick oxide layer 235 covering over the top surface of the device. In FIG. 8C, a dry contact oxide etch is carried out with a contact etch mask (not show) to open trenches 237 through the oxide layer 235 into the body regions 225 between the trenched gates 220. Then a boron angle ion implantation is carried out to form P+ region 240 along the sidewalls of the contact trenches 237. In FIG. 8D, a contact silicon etch is performed to open the trenches 237 deeper through the body region 225 and further into Epi layer 210.

Figure 8E:
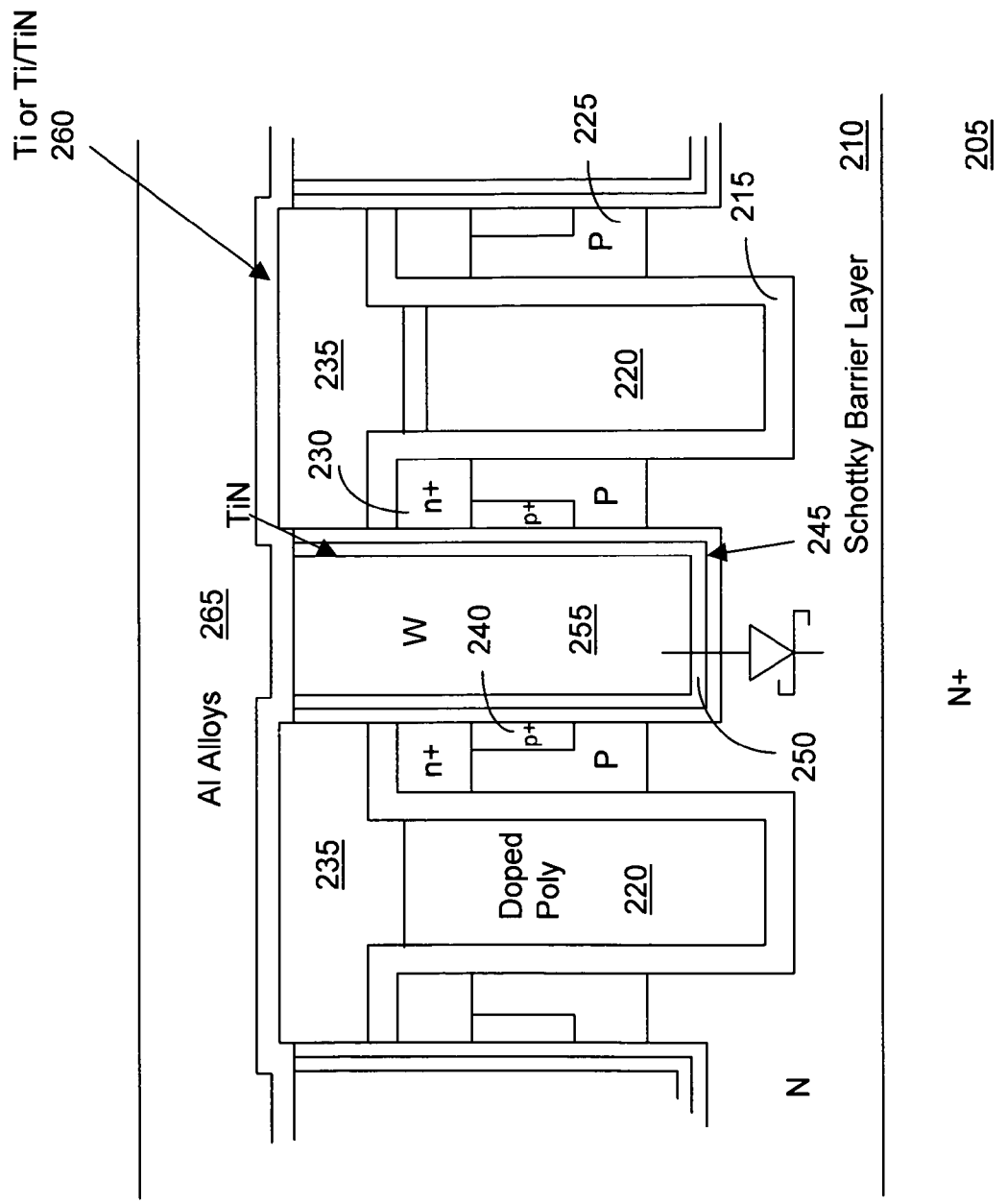
Figure 8F:
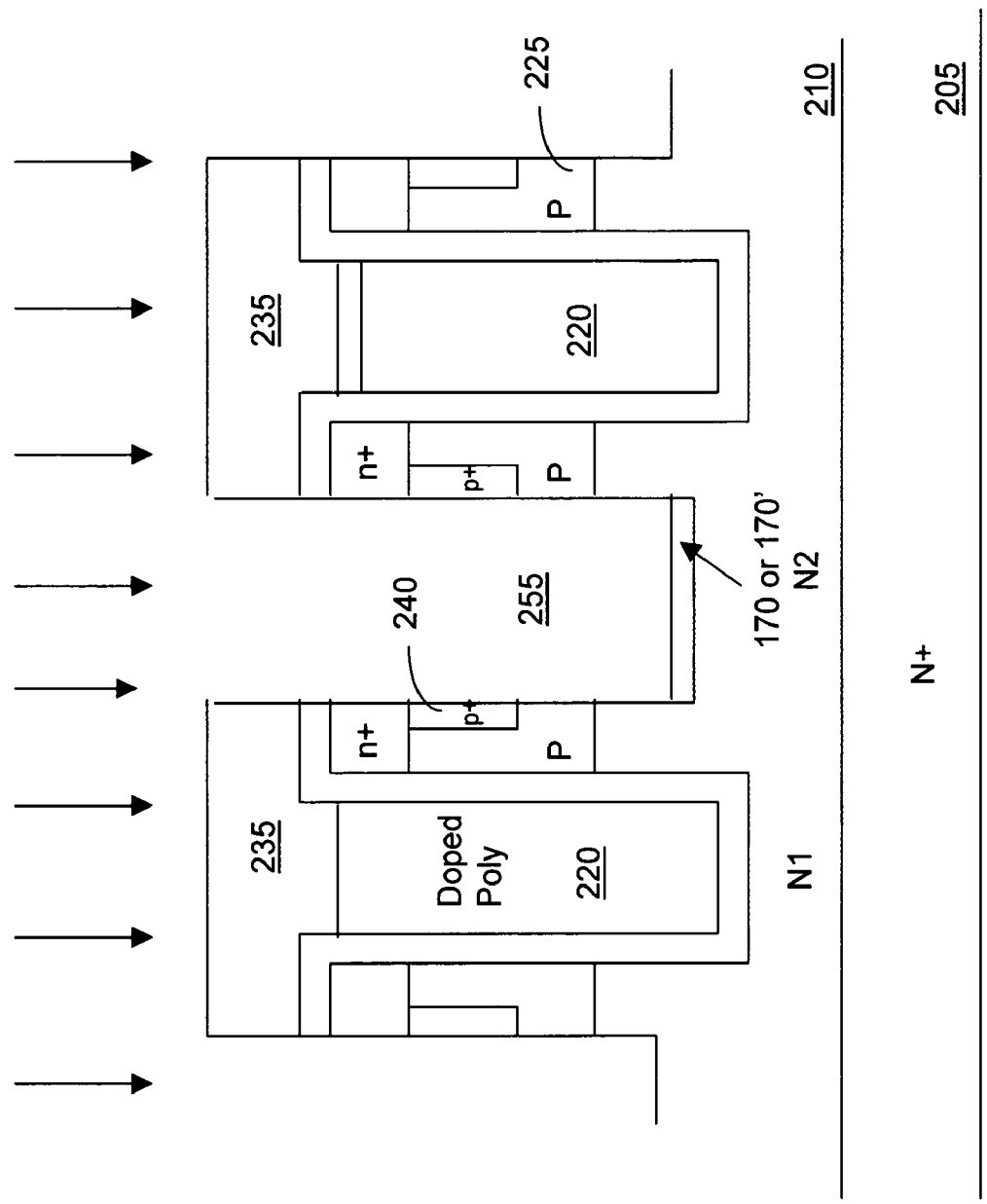
Figure 8G:
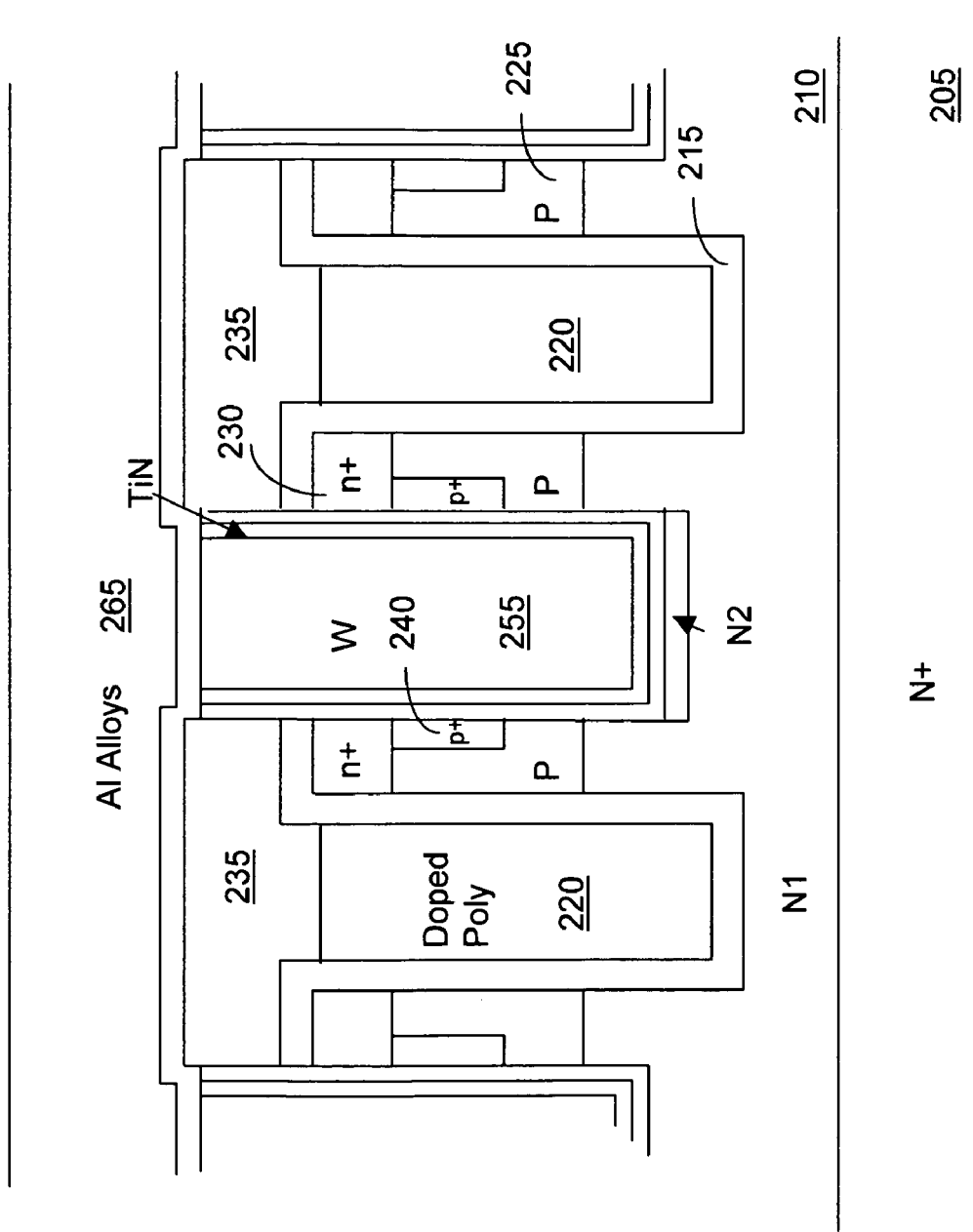

In FIG. 8E, a layer 245 of Co/TiN is deposited followed by a rapid thermal anneal process to form a CoSi2 250 thus forming a Schottky barrier layer. Then the tungsten contact plug 255 is deposited into the contact trench followed by a W/Co/TiN etch back to remove the W/Co/TiN layer from above the contact trenches 225. Then a Ti or TiN low resistance layer 260 is deposited over the top surface followed by depositing an aluminum alloy layer 265 as a metal contact layer. A metal patterning process is performed (not shown) to complete the manufacturing process of the device. FIG. 8F showing an implant process for implanting As ions to form the dopant region 170 with dopant concentration N2>N1 or implanting Boron or BF2 ions for the dopant region 170' N2<1 after completing the process of FIG. 8D and the process shown in FIG. 8G is the same as that described in FIG. 8E after the implanting process completed in FIG. 8F.

According to the above drawings and descriptions, this invention further discloses a method for manufacturing a trenched semiconductor power device includes a step of covering the MOSFET cell with an insulation layer and applying a contact mask for opening a source-body contact trench extending through the source and body regions and into an epitaxial layer below the body region for filling a contact metal plug therein. The method further includes a step of forming an embedded Schottky diode by forming a Schottky barrier layer along sidewall of the source-body contact trench in the epitaxial layer and near a bottom of the source-body contact trench below the contact metal plug with the Schottky barrier layer having a barrier height for reducing a leakage current through the embedded Schottky diode during a reverse bias between the drain and the source. The method further includes a step of forming a source-dopant region below the source-body contact trench in contact with the Schottky barrier layer of the Schottky diode having a different dopant concentration from the epitaxial layer surrounding the body region supported on the semiconductor substrate. In an embodiment, the method further includes a step of forming a contact enhancement dopant region along sidewalls of the source-body contact trench for improving an electrical contact of the contact metal plug to the body regions. In another embodiment, the step of forming the embedded Schottky diode further comprises a step of forming a CoSi2/TiN barrier layer at a bottom surface of the source-body contact trench. In another embodiment, the step of forming the embedded Schottky diode further comprises a step of forming a PtSi barrier layer at a bottom surface of the source-body contact trench. In another embodiment, the method further includes a step of forming the source-dopant region below the source-body contact trench in contact with the barrier layer of the Schottky diode having a dopant concentration of N2 with N2>N1 where N1 is a dopant concentration of an epitaxial layer surrounding the body region supported on the semiconductor substrate. In another embodiment, the method further includes a step of forming the source-dopant region below the source-body contact trench in contact with the barrier layer of the Schottky diode having a dopant concentration of N2 with N2<N1 to reduce a Drain-Source leakage current at a reverse bias where N1 is a dopant concentration of an epitaxial layer surrounding the body region supported on the semiconductor substrate. In another embodiment, the method further includes a step of forming the source-dopant region below the source-body contact trench in contact with the barrier layer of the Schottky diode having a dopant concentration of N2 with N2>N1 where N1 is a dopant concentration of an epitaxial layer surrounding the body region supported on the semiconductor substrate. The method further includes a step of forming a gate insulation layer padded on sidewalls and a bottom surface of the trenched gate and filling the trenched gate with a dielectric material by with the gate insulation layer on the bottom surface of the trenched gate significantly thicker than the gate insulation layer disposed along sidewalls of the trenched gate. In another embodiment, the method further includes a step of forming a gate insulation layer padded on sidewalls and a bottom surface of the trenched gate and filling the trenched gate with a dielectric material by with the gate insulation layer on the bottom surface of the trenched gate substantially same as the gate insulation layer disposed along sidewalls of the trenched gate. In another embodiment, the method further includes a step of forming a source-dopant region below the source-body contact trench in contact with the barrier layer of the Schottky diode having a dopant concentration of N2 with N2<N1 to reduce a Drain-Source leakage current at a reverse bias where N1 is a dopant concentration of an epitaxial layer surrounding the body region supported on the semiconductor substrate. The method further includes a step of forming a gate insulation layer padded on sidewalls and a bottom surface of the trenched gate and filling the trenched gate with a dielectric material by with the gate insulation layer on the bottom surface of the trenched gate significantly thicker than the gate insulation layer disposed along sidewalls of the trenched gate.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A method for manufacturing a metal oxide semiconductor field effect transistor (MOSFET) comprising a step of forming said MOSFET with a trenched gate surrounded by a source region encompassed in a body region above a drain region disposed on a bottom surface of a substrate, the method further comprising:
    covering said MOSFET cell with an insulation layer and applying a contact mask for opening a source-body contact trench extending through said source and body regions and into an epitaxial layer below said body region for filling a contact metal plug therein;
    forming an embedded Schottky diode by forming a Schottky barrier layer along sidewall of said source-body contact trench in said epitaxial layer and near a bottom of said source-body contact trench below said contact metal plug with said Schottky barrier layer having a barrier height for reducing a leakage current through said embedded Schottky diode during a reverse bias between said drain and said source and
    forming a source-dopant region below said source-body contact trench in contact with said Schottky barrier layer of said Schottky diode having a different dopant concentration from said epitaxial layer surrounding said body region supported on said semiconductor substrate.

2. The method of claim 1 further comprising a step of:
    forming a contact enhancement dopant region along sidewalls of said source-body contact trench for improving an electrical contact of said contact metal plug to said body regions.

3. The method of claim 1 wherein:
    said step of forming said embedded Schottky diode further comprising a step of forming a CoSi2/TiN barrier layer at a bottom surface of said source-body contact trench.

4. The method of claim 1 wherein:
    said step of forming said embedded Schottky diode further comprising a step of forming a PtSi barrier layer at a bottom surface of said source-body contact trench.

5. The method of claim 1 further comprising:
    forming said source-dopant region below said source-body contact trench in contact with said barrier layer of said Schottky diode having a dopant concentration of N2 with N2>N1 where N1 is a dopant concentration of an epitaxial layer surrounding said body region supported on said semiconductor substrate.

6. The method of claim 1 further comprising:
    forming said source-dopant region below said source-body contact trench in contact with said barrier layer of said Schottky diode having a dopant concentration of N2 with N2<N1 to reduce a Drain-Source leakage current at a reverse bias where N1 is a dopant concentration of an epitaxial layer surrounding said body region supported on said semiconductor substrate.

7. The method of claim 1 further comprising:
    forming said source-dopant region below said source-body contact trench in contact with said barrier layer of said Schottky diode having a dopant concentration of N2 with N2>N1 where N1 is a dopant concentration of an epitaxial layer surrounding said body region supported on said semiconductor substrate; and forming a gate insulation layer padded on sidewalls and a bottom surface of said trenched gate and filling said trenched gate with a dielectric material by with said gate insulation layer on said bottom surface of said trenched gate significantly thicker than said gate insulation layer disposed along sidewalls of said trenched gate.

8. The method of claim 1 further comprising:

forming a gate insulation layer padded on sidewalls and a bottom surface of said trenched gate and filling said trenched gate with a dielectric material by with said gate insulation layer on said bottom surface of said trenched gate substantially same as said gate insulation layer disposed along sidewalls of said trenched gate.

9. The method of claim 1 further comprising:

forming a source-dopant region below said source-body contact trench in contact with said barrier layer of said Schottky diode having a dopant concentration of N2 with N2<N1 to reduce a Drain-Source leakage current at a reverse bias where N1 is a dopant concentration of an epitaxial layer surrounding said body region supported on said semiconductor substrate; and forming a gate insulation layer padded on sidewalls and a bottom surface of said trenched gate and filling said trenched gate with a dielectric material by with said gate insulation layer on said bottom surface of said trenched gate significantly thicker than said gate insulation layer disposed along sidewalls of said trenched gate.

* * * * *